United States Patent
Hong

(10) Patent No.: US 6,899,609 B2
(45) Date of Patent: May 31, 2005

(54) CMP EQUIPMENT FOR USE IN PLANARIZING A SEMICONDUCTOR WAFER

(75) Inventor: Yong-Sung Hong, Osan (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/655,305

(22) Filed: Sep. 5, 2003

(65) Prior Publication Data
US 2004/0087257 A1 May 6, 2004

(30) Foreign Application Priority Data
Oct. 22, 2002 (KR) ................... 10-2002-0064457

(51) Int. Cl.$^7$ ................................. B24B 47/00
(52) U.S. Cl. .................. 451/388; 451/41; 451/56; 451/60; 451/287; 451/288; 451/443; 451/444; 451/446
(58) Field of Search ................. 451/41, 56, 60, 451/287, 288, 443, 444, 446

(56) References Cited
U.S. PATENT DOCUMENTS 6,206,760 B1 * 3/2001 Chang et al. ............. 451/41
6,402,598 B1   6/2002 Ahn et al.
6,405,399 B1   6/2002 Farber et al.
6,595,831 B1 * 7/2003 Hirokawa et al. ......... 451/36

* cited by examiner

*Primary Examiner*—Joseph J. Hail, III
*Assistant Examiner*—Shantese L. McDonald
(74) *Attorney, Agent, or Firm*—Volentine Francos & Whitt, PLLC

(57) ABSTRACT

Chemical mechanical polishing (CMP) equipment for use in planarizing a semiconductor wafer prevents slurry from being deposited on the surfaces of respective components of the equipment. The CMP equipment includes a turntable, a polishing pad mounted to the table so as to rotate with the table, a slurry supply unit for dispensing slurry onto the polishing pad, a polishing head unit for pressing a wafer downward atop the polishing pad, a conditioning unit for scoring the pad to maintain the surface of the polishing pad uniform, and a cleaning fluid supply unit. The cleaning solution supply unit has at least one spray nozzle by which cleaning solution is sprayed onto the polishing pad and respective components of the CMP equipment.

2 Claims, 3 Drawing Sheets

CM P EQUIPMENT FOR USE IN PLANARIZING A SEMICONDUCTOR WAFER

BACKGROUND OF THE INVENTION

1. Field of the Invention

The present invention relates to the manufacturing of semiconductor wafers. More particularly, the present invention relates to chemical mechanical polishing (CMP) equipment for planarizing wafers during the manufacturing of semiconductor devices.

2. Description of the Related Art

Semiconductor devices are generally made by subjecting wafers to such selective and repetitive processes as photolithography, etching, diffusion, chemical vapor deposition, ion implantation and metal deposition processes. However, before being undergoing any of such processes, the wafers may be subjected to a chemical mechanical polishing (CMP) process that planarizes the wafers to make it easy to form circuit patterns on the surfaces of the wafers.

The CMP process involves uniformly distributing slurry onto a surface of a polishing pad that rotates at a high speed, and placing a surface of a wafer to be polished onto the surface of the polishing pad. As a result, the surface of the wafer chemically reacts with the slurry and is physically abraded by the slurry under the force of the high speed rotation of the polishing pad.

FIGS. 1 and 2 show conventional CMP equipment 10. The CMP equipment 10 includes a table 12 capable of rotating at a high speed, a polishing pad 14 mounted to the table 12, a slurry supply nozzle 16 disposed above the table 12 for supplying slurry onto the polishing pad 14 during the planarization process, and a cleaning solution supply nozzle 18 for supplying a cleaning solution onto the surface of the polishing pad 14 when the polishing process has been completed. The cleaning solution is used to remove slurry, etc., from the surface of the polishing pad 14.

The slurry and the cleaning solution are supplied through the slurry supply nozzle 16 and the cleaning solution supply nozzle 18, respectively, onto a central portion of the polishing pad 14. At either of these times, the polishing pad 14 is rotated at a uniform speed. Accordingly, the slurry or the cleaning solution gradually flows from the central portion of the polishing pad 14 toward the outer peripheral edge of the polishing pad 14, whereby the slurry or the cleaning solution is uniformly distributed over the surface of the polishing pad 14. Eventually, the slurry and the cleaning solution flow over the outer peripheral edge of the polishing pad 14.

Meanwhile, a surface of the wafer W to be planarized is placed against the surface of the polishing pad 14 by a polishing head unit 20 to which the wafer W is mounted. The polishing head unit 20 is situated to one side of the table. At this time, the wafer W is rotated at a high speed by a head 22 of the head unit 20 while the head 22 is moved over a region that is roughly shown by the dotted line 20a in FIG. 3. Simultaneously, the head 22 is raised/lowered to hold the wafer W proximate the surface of the polishing pad 14 or press the wafer against the pad 14 whereupon the polishing process takes place.

A conditioning unit 24 is also disposed beside the table 12. The conditioning unit 24 has a pad conditioner 26 for cutting the surface of the polishing pad 14 to maintain the surface uniform, i.e., so that the polishing pad 14 planarizes the surface of the wafer W uniformly. The pad conditioner 26 rotates at a high speed, opposite the polishing pad 14, and receives a constant downward force. The pad conditioner 26 is moved over a conditioning region shown by the dotted line 24a in FIG. 3 to condition the polishing pad 14 while the pad 14 rotates at a high speed.

The operation of the respective components will now be described.

First, the table 12 is rotated at a high speed under the command of a control signal applied thereto. At this time, the slurry supply nozzle 16 continuously supplies a constant amount of slurry onto the central portion of the rotating polishing pad 14 so as to be uniformly distributed across the entire surface of the polishing pad 14. Also, the polishing head unit 20 moves the wafer W round-trip across the head region 20a, with one entire surface of the wafer W proximate the surface of the polishing pad 14 or in contact therewith. Accordingly, the surface of the wafer W in contact with the slurry or the polishing pad 14 is polished by chemically reacting with and physically rubbing against the slurry.

However, the upper surface of the polishing pad 14 eventually becomes irregular due to the contact with the wafer W. The conditioning unit 24 is used to obviate the problems that such an irregular surface of the polishing pad 14 would otherwise create. Specifically, the conditioning unit 24 rotates the pad conditioner 26 at a high speed, places the pad conditioner 26 in contact with the polishing pad 14, and simultaneously moves the pad conditioner 26 back and forth across the conditioning region 24a. As a result, the pad conditioner 26 cuts the entire surface of the polishing pad 14 to planarize it to a given thickness.

Once the polishing process for the wafer W or the conditioning process for the polishing pad 14 is completed, the formerly supplied slurry and particles from the conditioned (cut) polishing pad 14 remain on the surface of the polishing pad 14. If allowed to stay there, the slurry and particles would scratch or negatively affect the uniformity of the next wafer W to be polished.

Therefore, a cleaning process is performed at the completion of the polishing process or at some other time at which the removal of various foreign substances from the surface of the polishing pad 14 is required. The cleaning process is executed by supplying a cleaning solution through the cleaning solution supply nozzle 18 onto a central portion of the polishing pad 14 while the pad rotates at a high speed. The cleaning solution thus gradually flows toward the outer peripheral edge of the pad 14 due to the centrifugal force created by the high speed rotation of the polishing pad 14. At this time, the slurry and various foreign substances on the polishing pad 14 are slid an upper surface of the polishing pad 14, and toward the outer peripheral edge thereof, by the flow of the cleaning solution. Finally, the slurry and various foreign substances entrained by the cleaning solution deviate are forced over the outer peripheral edge of the polishing pad 14.

However, the slurry and the various foreign substances not only flow along the surface of the polishing pad 14 to the outer peripheral edge of the polishing pad 14, but also are entrained in fumes that rise from the surface of the polishing pad 14. The particulate matter of these fumes are deposited throughout the CMP chamber C including on the walls of the chamber C and on respective components of the CMP equipment 6. The deposited slurry and various foreign substances accumulate and solidify over time. The solidified slurry and various foreign substances eventually flake off and fall onto the polishing pad 14 during a polishing process, whereby they scratch the wafer W being polished.

Furthermore, a sensor (not shown) is usually provided for checking whether a wafer W is present on an arm of a transfer device for loading/unloading the wafers W into and from the CMP equipment 10. If such a sensor is covered with the slurry and various foreign substances from the fumes produced in the chamber C, the sensor outputs erroneous information to the controller of the CMP equipment 10. The malfunction of the sensor in this way may result in a collision between the wafers W or between a wafer W and other components of the CMP equipment 10. Such collisions will damage or otherwise break the wafers W.

The CMP equipment 10 is thus cleaned periodically to prevent these and other problems that would otherwise be caused by the deposited and solidified slurry and foreign substances. This cleaning process is laborious and thus, requires much time. Also, the slurry and various solidified foreign substances produce dust, which poses a danger to the health of workers and pollutes the respective components of the CMP equipment 10.

SUMMARY OF THE INVENTION

An object of the present invention is to provide chemical mechanical polishing (CMP) equipment that substantially overcomes one or more of the problems, limitations and disadvantages of the prior art.

Accordingly, one object of the present invention is to provide CMP equipment capable of preventing slurry and various foreign substances from remaining on the polishing pad of the CMP equipment following a polishing process and/or a conditioning process.

Another object of the present invention is to provide CMP equipment capable of preventing slurry and various foreign substances from depositing and solidifying on respective components of the CMP equipment.

It is still another object of the present invention to provide CMP equipment that requires less frequent cleaning that the prior art, and that provides a safer working environment by reducing the amount of dust that might otherwise be created by slurry and various foreign substances that are produced as the result of the CMP process.

According to one aspect of the present invention, the CMP equipment includes a turntable, a polishing pad mounted to the table so as to rotate with the table, a slurry supply unit for dispensing slurry onto the polishing pad, a polishing head unit for pressing a wafer downward atop the polishing pad, a conditioning unit for scoring the pad to maintain the surface of the polishing pad uniform, a cleaning fluid supply unit for spraying cleaning solution over a region in the CMP equipment encompassing at least a portion of the upper surface of the polishing pad, and a controller for controlling the operating components of the CMP equipment.

The cleaning solution supply unit can also be used to spray the cleaning solution over respective ones of the operating components of the CMP equipment, such as the polishing head unit and the pad conditioning unit.

The cleaning solution supply unit includes at least one cleaning solution supply line extending alongside the polishing the polishing pad (and the respective operating components), a spray nozzle installed at an end of the cleaning solution supply line and oriented to spray the cleaning solution over a predetermined region in the CMP equipment, and a regulator installed in the cleaning solution supply line for controlling the pressure of the cleaning solution issuing from the spray nozzle.

BRIEF DESCRIPTION OF THE DRAWING

The present invention will become more fully understood from the detailed description that follows, and the accompanying drawings in which.

DETAILED DESCRIPTION OF THE PREFERRED EMBODIMENTS

Figure 1:
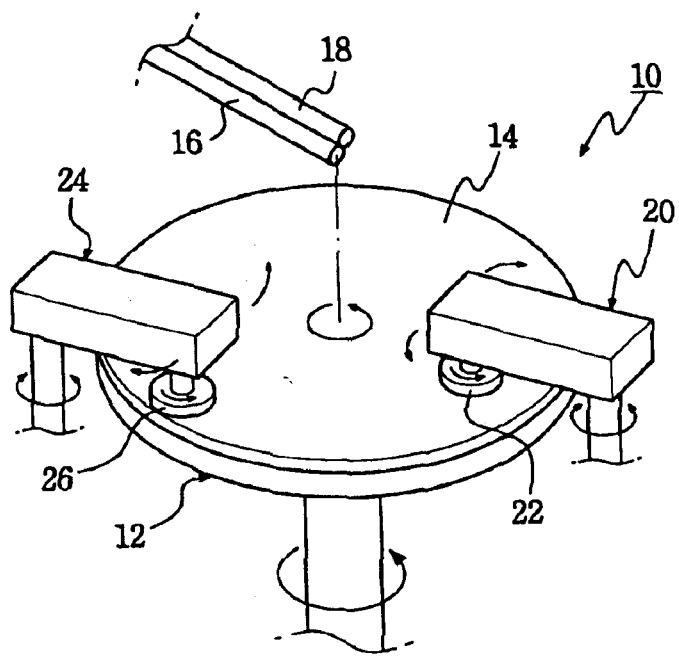
FIG. 1 is a perspective view of conventional CMP equipment.
Figure 2:
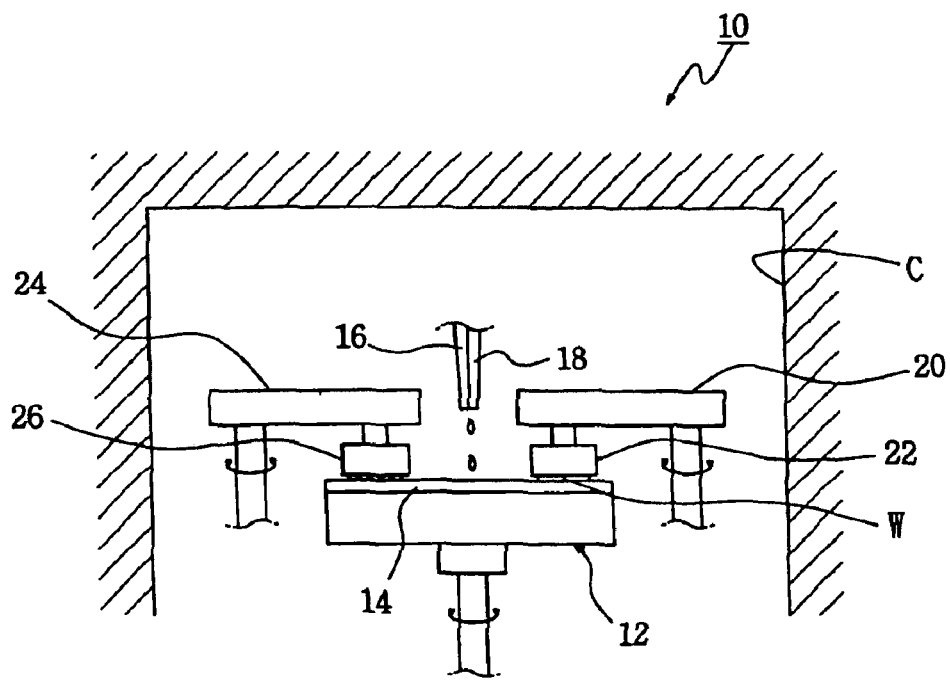
FIG. 2 is a side view of the conventional CMP equipment shown in FIG. 1.

CMP equipment for use in planarizing a semiconductor wafer according to the present invention will now be described with reference to FIGS. 4 and 5. It should be noted that the same reference characters designate like elements throughout the drawings.

Figure 4:
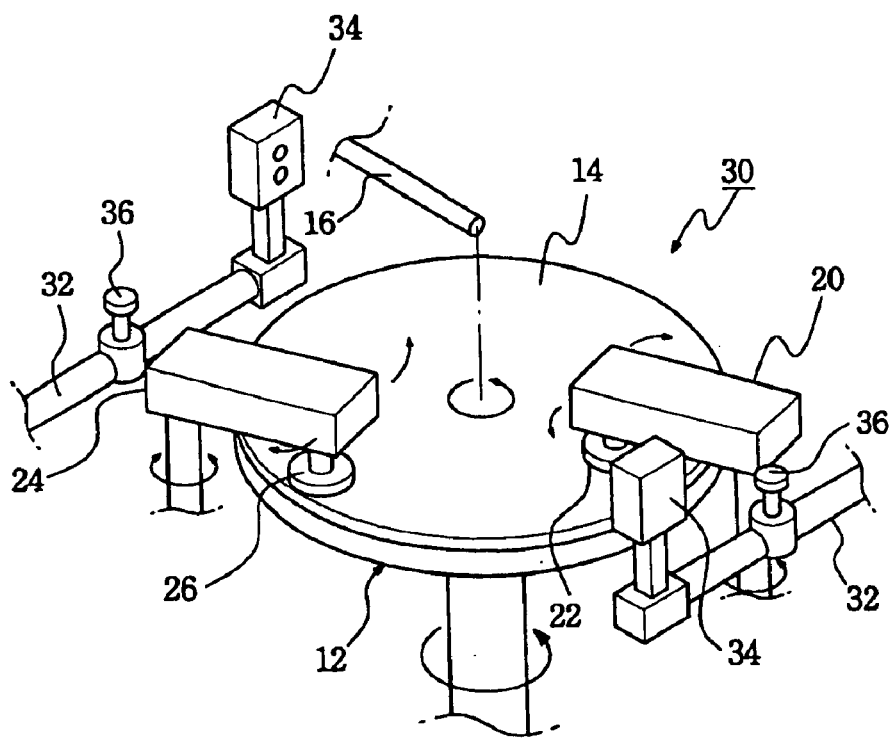
FIG. 4 is a perspective view of CMP equipment according to the present invention.
Figure 5:
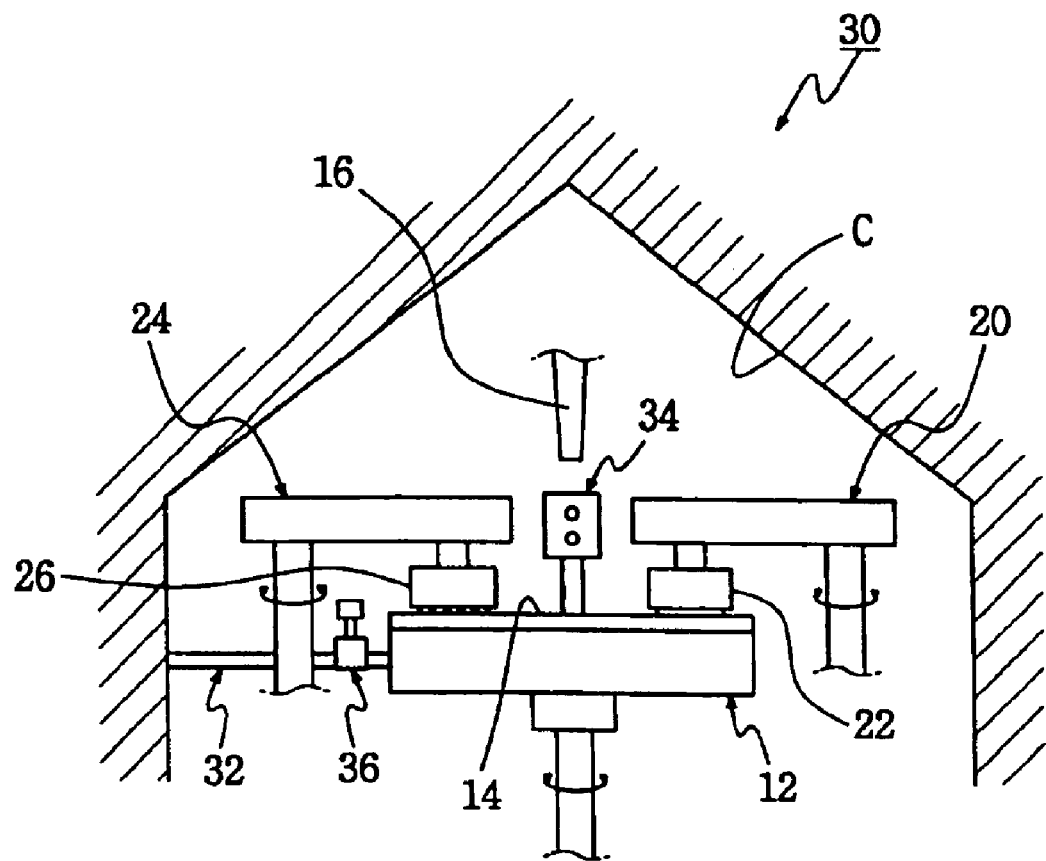
FIG. 5 is a side view of the CMP equipment according to the present invention.

Referring first to FIG. 4, the CMP equipment 30 includes a rotary table 12, a polishing pad 14 disposed on the rotary table so as to rotate therewith, and a slurry supply unit. The slurry supply unit comprises a slurry supply nozzle 16 disposed above the table 12 and positioned to supply slurry onto a central portion of the polishing pad 14 that includes the center of rotation of the pad 14.

The slurry that is supplied onto the central portion of the polishing pad 14 flows gradually from the central portion of the polishing pad 14 toward the outer peripheral edge thereof due to the centrifugal force created by the high speed rotation of the table 12. The slurry eventually begins to flow from the rim of the polishing pad 14. At this time, the slurry is supplied at a constant rate, whereby a uniform level of slurry is maintained across the entire upper surface of the polishing pad 14.

Figure 3:
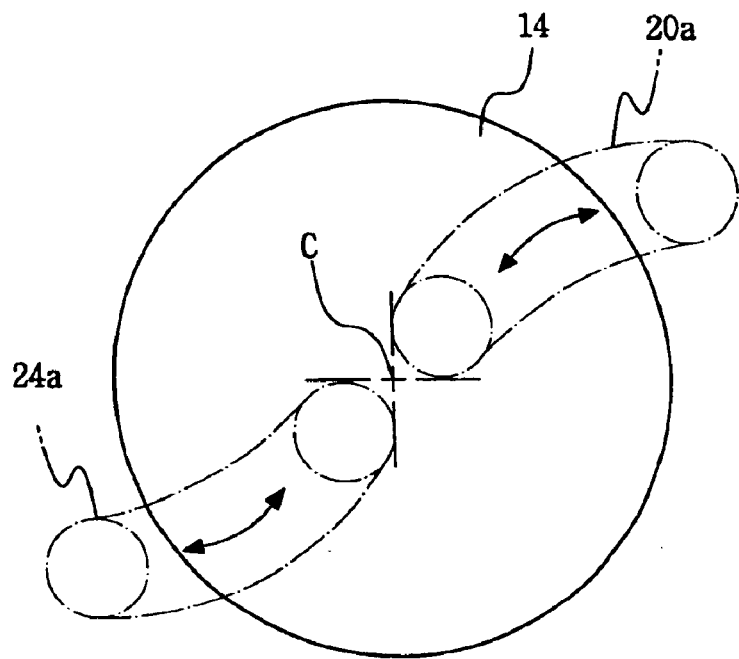
FIG. 3 is a plan view of the polishing pad of the conventional CMP equipment, illustrating regions over which a pad conditioner and a polishing head are moved.

The CMP equipment 30 also includes a polishing head unit 20 disposed beside the table 12. The wafer W is mounted to a polishing head 22 of the unit 20. The polishing head 22 may be moved up and/or down to position the wafer W proximate or against the upper surface of the polishing pad 14. The polishing head 22 is also rotatable to rotate the wafer W while the wafer W is proximate or against the upper surface of the polishing pad 14. Finally, the polishing head unit is swung about an axis of rotation to also move the wafer W across a region similar to the region 20a of FIG. 3.

Likewise, a conditioning unit 24 is also disposed beside the table 12. The conditioning unit 24 has a pad conditioner 26 for cutting the surface of the polishing pad 14 to maintain the surface uniform, i.e., so that the polishing pad 14 planarizes the surface of the wafer W uniformly. The pad conditioner 26 rotates at a high speed, opposite the polishing pad 14, and receives a constant downward force. The pad conditioner 26 is moved over a conditioning region shown by the dotted line 24a in FIG. 3 to condition the polishing pad 14 while the pad 14 rotates at a high speed.

The continuous supplying of slurry onto the polishing pad 14 rotating at a high speed, and the conditioning (scoring) of the polishing pad 14 by the pad conditioning unit 24 create fumes in the chamber C of the CMP equipment 30. Slurry and the various foreign substances that make up these fumes are deposited on the polishing pad 14 and the peripheral components of the CMP equipment 30.

The CMP equipment 30 also includes a cleaning solution supply unit. The unit includes one or more cleaning solution supply lines 32 disposed beside the table 12. The cleaning solution supply line 32 is equipped with a spray nozzle 34. The spray nozzle 34 is oriented to spray cleaning solution flowing through the line 32 onto the polishing pad 14 and/or onto the components of the CMP equipment described above. The cleaning solution supply unit also includes a flow regulator 36 and a control valve (not shown) disposed on the cleaning solution supply line 32 to control the pressure of the cleaning solution fed to the spray nozzle 34, and hence, the pressure of the spray, in response to a control signal applied from a controller (not shown).

The operation of these respective components of the CMP equipment 30 will now be described.

First, the table 12 is rotated at a high speed under the command of a control signal applied thereto. At this time, the slurry supply nozzle 16 continuously supplies a constant amount of slurry onto the central portion of the rotating polishing pad 14 so as to be uniformly distributed across the entire surface of the polishing pad 14. In addition, a wafer W is adhered to the polishing head 22 of the polishing unit 20 by suction (a vacuum) or surface tension. The polishing head unit 20 moves the wafer W round-trip across a head region, with one entire surface of the wafer W proximate the surface of the polishing pad 14 or in contact therewith. Accordingly, the surface of the wafer W in contact with the slurry or the polishing pad 14 is polished by chemically reacting with and physically rubbing against the slurry.

The upper surface of the polishing pad 14 eventually becomes irregular due to the contact with the wafer W. Therefore, after the wafer W has been polished, the polishing head 22 is raised to move the wafer W above the pad 14 and the slurry on the pad. Subsequently, the conditioning unit 24 rotates the pad conditioner 26 at a high speed, places the pad conditioner 26 in contact with the polishing pad 14, and simultaneously moves the pad conditioner 26 back and forth across a conditioning region. As a result, the pad conditioner 26 cuts the entire surface of the polishing pad 14 to planarize it to a given thickness.

Once the polishing process for the wafer W or the conditioning process for the polishing pad 14 is completed, the formerly supplied slurry and particles from the conditioned (cut) polishing pad 14 remain on the surface of the polishing pad 14. Deposits of the slurry and the foreign substances are also formed above the pad 14 on respective parts of the CMP equipment 30, such as on the walls of the chamber C. If allowed to stay on the pad 14, or if allowed to fall onto the pad 14 and remain there, the slurry and particles would scratch or negatively affect the uniformity of the next wafer W to be polished.

Therefore, a cleaning process is performed using the cleaning solution supply unit to remove the various kinds of foreign substances from the surface of the polishing pad 14 at the completion of the polishing or conditioning process. The cleaning process entails spraying a cleaning solution onto the entire surface of the polishing pad 14 while the pad 14 is rotated at a high speed and over an entire region encompassing the polishing head unit 20 and the pad conditioning unit 24.

Such a spraying of the cleaning solution prevents the slurry and the various foreign substances from solidifying on the polishing pad 14, and also increases the mobility of the foreign substances so that the slurry and foreign substances move more readily along the surface of the pad 14, i.e., by the cumulative effect of the force of the spray and the centrifugal force created by the rotation of the pad 14. In addition, the spraying of the cleaning solution prevents the slurry and the various foreign substances deposited on the respective components of the polishing head unit 20 and the pad conditioning unit 24 from solidifying. Even though such foreign substances are sprayed off of the respective components and fall onto the surface of the polishing pad 14, the foreign substances are entrained in a great deal of liquid. Therefore, the liquid condition at the surface of the polishing pad 14 is not likely to damage a wafer W during the next polishing process.

Further, the spray nozzle 34 can be oriented/designed to spray the cleaning solution onto a sensor (not shown) for checking for presence of a wafer W at a loading/unloading position. Therefore, even if fumes envelop the sensor and leave slurry or foreign substances deposited on the sensor; the deposits are diluted with the cleaning solution and are thereby removed before they thicken and solidify. Thus, the cleaning solution supply unit ensures the correct operation of the sensor and thus prevents associated operating errors from occurring.

In addition, the dust in the CMP equipment is minimized because the spray of the cleaning solution prevents the slurry and the various foreign substances deposited on the polishing pad 14 and the respective components from solidifying in the first place. Accordingly, a safer working environment is provided. Moreover, a comparatively longer period of time is required between the periodic cleanings typically required for the overall maintenance of the equipment. Thus, the present invention can reduce the labor associated with maintaining the equipment, and reduce the downtime of the equipment, thereby increasing the operating efficiency of the CMP equipment.

Finally, various changes to and modifications of the present invention will become apparent to those skilled in the art. Thus, all such changes and modifications that fall within the scope of the appended claims are seen to be within the true spirit of the present invention.

What is claimed is:

1. Chemical mechanical polishing (CMP) equipment for use in planarizing a semiconductor wafer, said equipment comprising: a turntable, a polishing pad disposed atop said turntable; a slurry supply unit that dispenses slurry onto an upper surface of the polishing pad; a head polishing unit having a polishing head positionable over the upper surface of the polishing pad, said polishing head being rotatable to rotate a wafer atop said polishing pad; a conditioning unit having a pad conditioning head that is movable into contact with said polishing pad and has a serrated surface that conditions said polishing pad when in contact with the pad; and a cleaning solution supply unit through which a cleaning solution is supplied, said cleaning solution supply unit including at least one cleaning solution supply line disposed beside said turntable, and a spray nozzle disposed at an end of each said cleaning solution supply line and oriented to spray the cleaning solution over a region encompassing the entire upper surface of said polishing pad, and said polishing head and said conditioning head.

2. The CMP equipment of claim 1, wherein said cleaning solution supply unit further includes a flow regulator disposed in-line with each said cleaning solution supply line so as to control the pressure of the cleaning solution flowing from each said spray nozzle.

* * * * *